(12) United States Patent
Stave et al.

(10) Patent No.: US 11,003,386 B2
(45) Date of Patent: May 11, 2021

(54) METHODS FOR ON-DIE MEMORY TERMINATION AND MEMORY DEVICES AND SYSTEMS EMPLOYING THE SAME

(71) Applicant: Micron Technology, Inc., Boise, ID (US)

(72) Inventors: Eric J. Stave, Meridian, ID (US);
Thomas H. Kinsley, Boise, ID (US);
Matthew A. Prather, Boise, ID (US)

(73) Assignee: Micron Technology, Inc., Boise, ID (US)

(*) Notice: Subject to any disclaimer, the term of this patent is extended or adjusted under 35 U.S.C. 154(b) by 43 days.

(21) Appl. No.: 16/015,042

(22) Filed: Jun. 21, 2018

(65) Prior Publication Data
US 2019/0155544 A1  May 23, 2019

Related U.S. Application Data

(60) Provisional application No. 62/590,116, filed on Nov. 22, 2017.

(51) Int. Cl.
*G06F 3/06* (2006.01)
*G11C 7/10* (2006.01)
*G11C 11/4093* (2006.01)

(52) U.S. Cl.
CPC ............ *G06F 3/0659* (2013.01); *G06F 3/061* (2013.01); *G06F 3/0673* (2013.01); *G11C 7/1048* (2013.01); *G11C 7/1051* (2013.01); *G11C 7/1057* (2013.01); *G11C 7/1078* (2013.01); *G11C 11/4093* (2013.01); *G11C 7/1042* (2013.01); *G11C 2207/2254* (2013.01)

(58) Field of Classification Search
CPC ............... G11C 7/1057; G11C 7/1051; G11C 2207/2254; G11C 11/4093; G11C 7/1048; G11C 7/1078; G11C 7/1042; G06F 3/061; G06F 3/0659; G06F 3/0673
USPC ........................................................ 711/154
See application file for complete search history.

(56) References Cited

U.S. PATENT DOCUMENTS

| | | | | |
|---|---|---|---|---|
| 10,205,431 B2* | 2/2019 | Kang | ...................... | G11C 16/08 |
| 10,424,356 B2* | 9/2019 | Howe | ................... | G11C 7/1057 |
| 2005/0212551 A1 | 9/2005 | So et al. | | |
| 2008/0315913 A1* | 12/2008 | Kim | ...................... | G11C 7/1057 326/30 |

(Continued)

OTHER PUBLICATIONS

International Application No. PCT/US2018/044436—International Search Report and Written Opinion, dated Nov. 13, 2018, 12 pages.

*Primary Examiner* — Hashem Farrokh
(74) *Attorney, Agent, or Firm* — Perkins Coie LLP (57) ABSTRACT

Methods, systems, and apparatuses related to memory operation with on-die termination (ODT) are provided. A memory device may be configured to provide ODT at a first portion (e.g., rank) during communications at a second portion (e.g., rank). For example, a memory device may receive a first command instructing a first portion to perform a first communication. The device may transmit, from the first portion, a signal instructing a second portion to enter an ODT mode. The device may perform, with the first portion, the first communication with a host while the second portion is in the ODT mode. The signal may be provided at an ODT I/O terminal of the first portion coupled to an ODT I/O terminal of the second portion.

16 Claims, 4 Drawing Sheets

(56) References Cited

U.S. PATENT DOCUMENTS

| | | | |
|---|---|---|---|
| 2013/0257475 A1* | 10/2013 | Kao | H03K 19/017545 |
| | | | 326/30 |
| 2014/0002131 A1* | 1/2014 | Shaeffer | G11C 5/063 |
| | | | 326/30 |
| 2015/0098285 A1 | 4/2015 | Huber et al. | |
| 2016/0314085 A1 | 10/2016 | Ware et al. | |
| 2017/0237431 A1 | 8/2017 | McCall et al. | |
| 2017/0288634 A1 | 10/2017 | Kang et al. | |
| 2018/0061472 A1* | 3/2018 | Hyun | G11C 7/22 |

* cited by examiner

METHODS FOR ON-DIE MEMORY TERMINATION AND MEMORY DEVICES AND SYSTEMS EMPLOYING THE SAME

CROSS-REFERENCE TO RELATED APPLICATIONS

This application claims the benefit of U.S. Provisional Application No. 62/590,116, filed Nov. 22, 2017, which is incorporated herein by reference in its entirety.

TECHNICAL FIELD

The present disclosure generally relates to methods for on-die memory termination and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Memory devices and memory systems can include multiple separately-addressable memory arrays, ranks, banks, channel, or other sub-divisions of memory capacity. In some such devices and systems, multiple separately-addressable memory portions may have terminals connected to one or more common busses (e.g., a data bus, a command/address bus, a clock signal bus, etc.). To improve the signal quality on a bus during communication with one of the separately-addressable portions, one or more terminals of another non-communicating memory portion may enter an "on-die termination" (ODT) mode, in which the impedance at the one or more terminals of the non-communicating portion is increased (e.g., to minimize signal reflections or other potentially signal-degrading or noise-contributing effects).

In some memory systems, a connected host device can indicate to the non-communicating (e.g., non-targeted) memory portion to enter an on-die termination mode with a command (e.g., on a command/address bus) addressed specifically to the non-targeted memory portion. Each command to enter an ODT mode can cause a command decoder of the non-targeted memory portion to consume power in decoding the command, which can contribute to a significant increase in the power consumption of a memory system. It is therefore desirable to provide a way to manage the ODT modes of a memory system with greater power efficiency.

Accordingly, several embodiments of the present technology are directed to memory devices, systems including memory devices, and methods of operating memory devices in which on-die termination can be provided at a second portion during communications at a first portion, without requiring on-die termination commands to be provided to or decoded by the second portion. In one embodiment, a method may comprise receiving a first command instructing a first portion of a memory system to perform a first communication with a memory host, transmitting, from the first portion of the memory system to a second portion of the memory system, a signal instructing the second portion to enter an on-die termination mode, and performing, with the first portion, the first communication while the second portion is in the on-die termination mode based at least in part on the signal.

Figure 1:
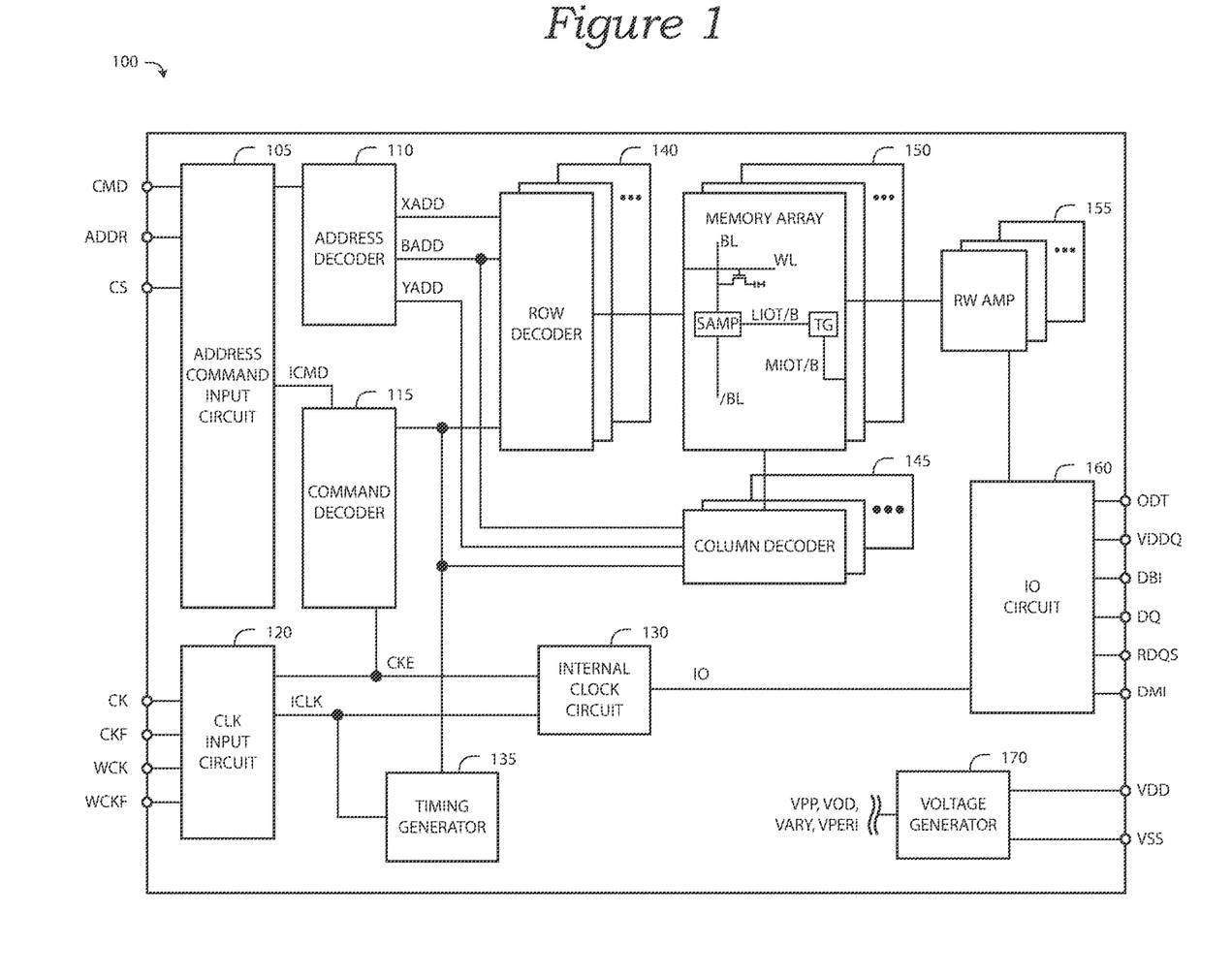
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can provide memory capacity with multiple memory arrays, or with a single array that is sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., clock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory. When operating such a memory device, to reduce undesirable noise on a common signal path (e.g., a clock path, a data bus, etc.), the memory device can utilize on-die termination to provide high impedance at those terminals of the memory device corresponding to the separately-addressable portions of memory that are not communicating on the common signal path. For example, when a connected host or memory controller accesses a first channel of the memory device, terminals of the memory device corresponding to a second channel can be provided with high impedance by on-die termination circuitry (e.g., integral to a corresponding i/o circuit 160, clock input circuit 120, or the like).

One approach to initiating on-die termination includes a host providing a signal (e.g., via a dedicated or shared pin or terminal, such as on-die termination terminal ODT) to the non-targeted portion of the memory system or device to provide termination during a communication performed by a targeted portion. Some memory hosts are not configured to provide an on-die termination signal, however (e.g., memory hosts complying to a memory standard that does not include a host-accessible on-die termination terminal in a memory device, such as a DDR5 memory device). Accordingly, another approach to initiating on-die termination includes a host providing a command (e.g., via the command/address bus) to the non-targeted portion of the memory system or device to provide termination during a communication performed by a targeted portion. For example, a command on a shared command/address bus can indicate to both the targeted and non-targeted portion that a communication (e.g., a read operation, a write operation, an erase operation, a status inquiry operation, etc.) is to be performed, while dedicated chip select terminals for each portion can indicate which portion is targeted (e.g., by a pulse lasting a single clock cycle) and which is non-targeted (e.g., by a pulse lasting two clock cycles). Such an approach is illustrated schematically in the timing diagram 200 of FIG. 2, in accordance with one aspect of the present technology.

Figure 2:
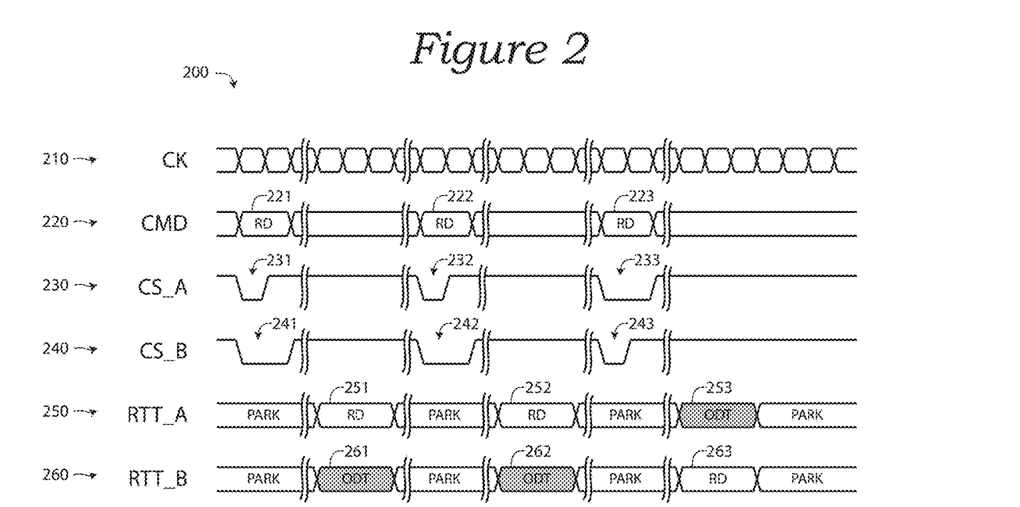
FIGS. 2 and 3 are simplified timing diagrams schematically illustrating the operation of memory systems in accordance with embodiments of the present technology.

As can be seen with reference to FIG. 2, in a memory device or system with two or more separately-addressable portions (e.g., two channels of a memory device, two memory devices of a memory system, etc.), a common command/address bus 220 can be used to indicate to the portions that a communication is to be performed by one of the portions (e.g., via a read command). A dedicated chip select terminal for each portion (e.g., CS_A 230 and CS_B 240) can be used to provide an indication to each portion whether it is targeted or non-targeted for the communication. In response to receiving an indication that is not the target of a command to communicate, the non-targeted portion can enter an on-die termination mode for the duration of the communication. In this regard, the timing diagram 200 of FIG. 2 illustrates a sequence of read commands targeting different channels of a memory device.

As illustrated, the first read command 221 is sent with corresponding indications 231 and 241 on the chip select terminals 230 and 240 that the target of the first read command corresponds to the first channel 250 of the memory device (e.g., by pulsing a chip select line low for one cycle of a clock 210 to indicate the targeted portion, and for two cycles of the clock 210 to indicate the non-targeted portion). Accordingly, the second channel 260 of the memory device enters an on-die termination mode 261 for the duration of a communication 251 of the first channel 250. Following the communication 251, the second channel 260 returns to a default or "parked" mode of impedance. A second read command 222 is similarly sent with corresponding indications 232 and 242 on the chip select terminals 230 and 240 that the target of the second read command corresponds to the first channel 250 of the memory device. Accordingly, the second channel 260 of the memory device enters an on-die termination mode 262 for the duration of a communication 252 of the first channel 250. Following the communication 252, the second channel 260 returns to the parked mode of impedance. A third read command 223 is sent with corresponding indications 233 and 243 on the chip select terminals 230 and 240 that the target of the third read command corresponds to the second channel 260 of the memory device. Accordingly, the first channel 250 of the memory device enters an on-die termination mode 253 for the duration of a communication 263 of the second channel 260. Following the communication 263, the first channel 250 returns to the parked mode of impedance.

A drawback to this approach of providing on-die termination commands to a non-targeted memory portion with each command to a targeted portion (e.g., with a corresponding indication on a chip select terminal) is that the non-targeted memory portion consumes power in decoding each command. In this regard, the command decoder of a memory device (e.g., command decoder 115) may be configured to "wake up" (e.g., to deliver power or signal voltages to one or more components previously in a no-power, low-power, or signal-disconnected state) in response to pulsing a corresponding chip select line low (e.g., whether for one or two clock cycles). Moreover, alternating the impedance from a parked mode to a termination mode (e.g., a read termination mode, a write termination mode, etc.) and back may further consume additional power. Accordingly, embodiments of the present technology may solve the foregoing problems by providing on-die termination at a non-targeted memory portion without the power consumption caused by decoding a non-targeted communication (e.g., read, write, status, etc.) command. Rather, in one embodiment, a non-targeted memory portion can be configured to provide on-die termination in response to an on-die termination signal received from a targeted memory portion at an on-die termination terminal of the non-targeted portion.

Figure 3:
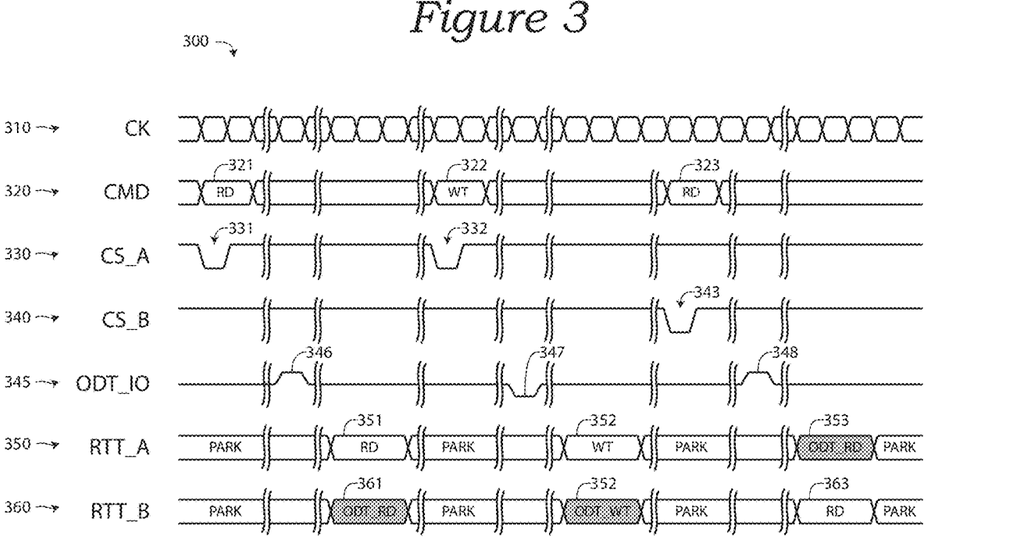

Turning to FIG. 3, a simplified timing diagram 300 schematically illustrates the operation of a memory system in accordance with an embodiment of the present technology. As can be seen with reference to FIG. 3, in a memory device or system with two or more separately-addressable portions (e.g., two channels of a memory device, two memory devices of a memory system), a common command/address bus 320 can be used to indicate to the portions that a communication is to be performed by one of the portions (e.g., via a read command). Unlike the approach illustrated in FIG. 2, however, in the approach illustrated in FIG. 3, the non-targeted memory portion does not receive an indication from the host on its chip select terminal. Rather, the targeted memory portion, in response to a command instructing it to perform a communication, transmits a signal to the second memory portion (e.g., from a first ODT terminal of the first portion to a second ODT terminal of the second portion) instructing it to provide on-die termination. In this regard, a first read command 321 is sent with a corresponding indication 331 on the chip select terminal 330 that the target of the first read command corresponds to the first channel 350 of the memory device (e.g., by pulsing a chip select line low for one cycle of a clock 310 to indicate the targeted portion). The first channel 350 of the memory device, in response to the first read command 321, transmits an on-die termination signal 346 to the second channel 360 of the memory device via a connected on-die termination terminal 345 before performing the communication 351.

According to one aspect of the subject technology, the on-die termination signal 346, unlike a command received on the command/address bus 320, does not trigger the second channel 360 to perform energy-intensive decoding, but instead can directly trigger corresponding circuitry of the second channel to enter an on-die termination mode 361 (e.g., a non-target read termination mode) for the duration of the communication 351. Following the communication 351, the second channel 360 returns to a default or "parked" mode of impedance.

As can be seen with reference to FIG. 3, the on-die termination signal 346 can indicate to the non-target memory portion not only to enter an on-die termination mode, but can also indicate to the non-target memory portion which on-die termination mode to enter. In this regard, the on-die termination signal 346 indicates that the on-die termination mode 361 is a non-target read termination mode by driving a voltage at the on-die termination terminal 345 high. For a write operation, however, a different on-die termination mode may be desired. For example, a write command 322 is sent with a corresponding indication 332 on the chip select terminal 330 that the target of the write command corresponds to the first channel 350 of the memory device. Accordingly, the first channel 350 of the memory device, in response to the write command 322, transmits an on-die termination signal 347 to the second channel 360 of the memory device via the connected on-die termination terminal 345. The on-die termination signal 347 indicates that the on-die termination mode 362 is a non-target write on-die termination mode by driving a voltage at the on-die termination terminal 345 low. Accordingly, the second channel 360 of the memory device, in response to the on-die termination signal 347, enters the on-die termination mode 362 while the first channel 350 performs the communication 352. Following the communication 352, the second channel 360 returns to the parked mode of impedance.

In one embodiment of the subject technology, the on-die termination terminal 345 of the first memory portion may be an input/output terminal configured both to transmit a first indication to the second memory portion instructing the second memory portion to provide on-die termination, as well as to receive a second indication from the second memory portion instructing the first memory portion to provide on-die termination. In this regard, as can be seen with reference to FIG. 3, a second read command 323 is sent with a corresponding indication 343 on the chip select terminal 340 that the target of the second read command corresponds to the second channel 360 of the memory device. Accordingly, the second channel 360 of the memory device, in response to the second read command 323, transmits an on-die termination signal 348 (e.g., a non-target read on-die termination signal corresponding to a high voltage at the on-die termination terminal 345) to the first channel 350 of the memory device via the connected on-die termination terminal 345. In response to the on-die termination signal 348, the first channel 350 of the memory device provides enters an on-die termination mode (e.g., an on-target read on-die termination mode) while the second channel 360 performs the communication 353. Following the communication 353, the first channel 350 returns to the parked mode of impedance.

Although in the foregoing embodiments, on-die termination signals have been illustrated and described as indicating a desired on-die termination mode with a voltage level (e.g., a high voltage corresponding to a non-target read level of termination, and a low voltage corresponding to a non-target write level of termination), in other embodiments of the present technology, other approaches to indicating a desired mode of on-die termination may be used. For example, an on-die termination signal can indicate different modes of on-die termination with different durations (e.g., one clock cycle corresponding to a first mode, two clock cycles corresponding to a second mode, etc.). In yet other embodiments, combinations of voltage, duration, and/or other properties of the on-die termination signal can similarly communicate information about a desired on-die termination mode, duration, or the like.

According to one aspect of the present technology, electrically coupling a single on-die termination I/O terminal on each of two memory portions (e.g., memory devices, channels, banks, ranks, etc.) can allow the foregoing approach to on-die termination to function with a single terminal per portion. In other embodiments, however, multiple terminals can be configured to provide similar functionality (e.g., two terminals in each portion, corresponding to an ODT input signal and an ODT output signal).

In one embodiment of the present technology, an on-die termination terminal can be a dedicated terminal (e.g., a terminal whose only function is to communicate an on-die termination signal). In another embodiment, however, an on-die termination terminal can be a multi-function terminal (e.g., a terminal which can provide additional functionality for communicating between a first and a second memory portion).

Although in the foregoing example embodiments, memory devices and systems with just two memory portions have been illustrated, the foregoing approaches to on-die termination have application to memory devices and systems with more than two channels or other sub-addressable portions. As will be readily understood by those skilled in the art, the power-saving benefits of these approaches will be even greater for devices in which more on-die termination commands corresponding to a single communication command can be omitted.

Although in the foregoing example embodiments, the communications performed by one memory portion while another is in an on-die termination mode have been described and illustrated as read and write operations (e.g., with corresponding read and write levels of on-die termination), in other embodiments of the present technology, the foregoing and following approaches can similarly be applied to other communications (e.g., status operations, etc.), with corresponding levels of termination (e.g., non-targeted status level termination, etc.).

Figure 4:
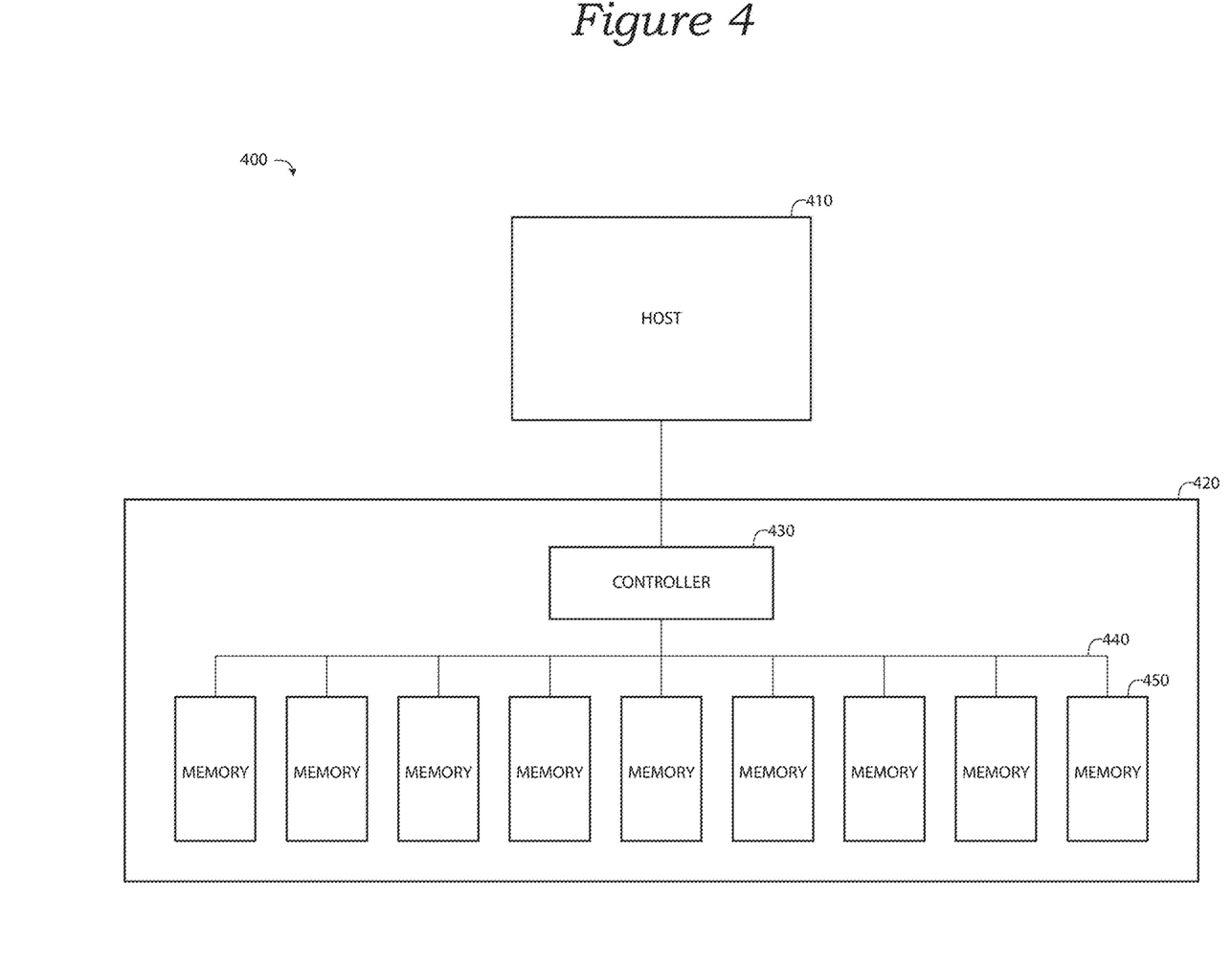
FIG. 4 is a simplified block diagram schematically illustrating a memory system in accordance with an embodiment of the present technology.

FIG. 4 is a simplified block diagram schematically illustrating a memory system 400 in accordance with an embodiment of the present technology. Memory system 400 includes a host device 410 operably coupled to a memory module 420 (e.g., a dual in-line memory module (DIMM)). Memory module 420 can include a controller 430 operably connected by a bus 440 to a plurality of memory devices 450. In accordance with one embodiment of the present disclosure, the host device 410 can communicate with a first one of the memory devices 450 (e.g., via a read command, a write command, etc. communicated over the bus 440), triggering the first memory device to transmit an on-die termination signal (e.g., such as on-die termination signal 346 in timing diagram 300) to one or more of the other memory devices 450 (e.g., over the bus 440, or via one or more dedicated terminals separate from the bus 440). In an alternative embodiment, the controller 430 can communicate with a first one of the memory devices 450 (e.g., via a read command, a write command, etc. communicated over the bus 440), triggering the first memory device to transmit an on-die termination signal (e.g., such as on-die termination signal 346 in timing diagram 300) to one or more of the other memory devices 450 (e.g., over the bus 440, or via one or more dedicated terminals separate from the bus 440. In this regard, the controller 430 can intermediate between the host device 410 (e.g., which may send a communication (e.g., read, write, etc.) command to a targeted memory device concurrently with an ODT command directed at the non-targeted memory devices) and the memory devices 450 to provide the command to the targeted memory device without providing the ODT command to the other memory devices, relying instead on the targeted memory device to provide an ODT command as set forth in greater detail above.

Figure 5:
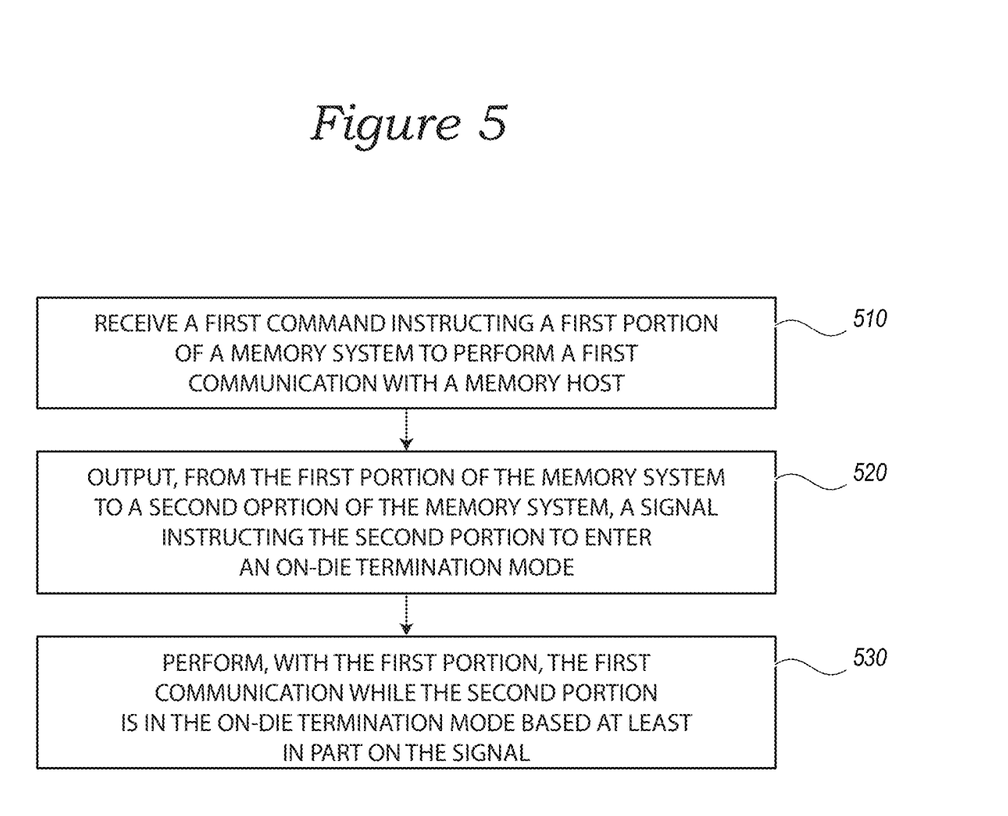
FIG. 5 is a flow chart illustrating a method of operating a memory system in accordance with an embodiment of the present technology.

FIG. 5 is a flow chart illustrating a method of operating a memory system in accordance with an embodiment of the present technology. The method includes receiving a first command instructing a first portion of the memory system to perform a first communication with a memory host (box 510). According to one aspect of the present disclosure, the command receiving features of box 510 may be implemented with a command/address input circuit 105 and/or terminals connected thereto, as illustrated in FIG. 1 in greater detail, above.

The method further includes transmitting, from the first portion of the memory system to a portion device of the memory system, a signal instructing the second portion to enter an on-die termination mode (box 520). According to one aspect of the present disclosure, the signal transmitting features of box 520 may be implemented with an input/output circuit 160 and/or terminals connected thereto, as illustrated in FIG. 1 in greater detail, above.

The method further includes performing, with the first portion, the first communication while the second portion is in the on-die termination mode based at least in part on the signal (box 530). According to one aspect of the present disclosure, the communication features of box 530 may be implemented with a memory array 150, decoders (e.g., address decoder 110, command decoder 115, row decoder 140, column decoder 145, etc.) connected thereto, and/or IO circuit 160, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of operating a memory system, comprising:
receiving a first command instructing a first portion of the memory system to perform a first communication with a memory host;
transmitting, from the first portion of the memory system to a second portion of the memory system, a signal instructing the second portion to enter an on-die termination mode; and
performing, with the first portion, the first communication while the second portion is in the on-die termination mode,
wherein an impedance level of the on-die termination mode is indicated by either a voltage or a duration of the signal, and
wherein the first command does not include a second indication on a second chip select terminal of the second memory device that the second portion is not targeted by the first command.

2. The method of claim 1, wherein the second portion exits the on-die termination mode after the first communication is completed.

3. The method of claim 1, wherein the transmitting of the signal occurs on a first on-die termination terminal of the first portion electrically connected to a second on-die termination terminal of the second portion.

4. The method of claim 3, wherein the first and second on-die termination terminal are input/output terminals.

5. The method of claim 1, wherein the first command includes a first indication on a first chip select terminal of the first memory device that the first portion is targeted by the first command.

6. The method of claim 1, wherein the first communication is one of a read or a write operation.

7. The method of claim 1, wherein a single semiconductor die comprises the first portion of the memory system and the second portion of the memory system.

8. A memory system, comprising:
a first memory device including a first on-die termination terminal; and
a second memory device including a second on-die termination terminal electrically coupled to the first on-die termination terminal;
wherein the first memory device includes first circuitry configured to:
receive a first command instructing the first memory device to perform a first communication with a memory host;
transmit, based at least in part on the first command, a signal at the first on-die termination terminal instructing the second memory device to enter an on-die termination mode, and
wherein an impedance level of the on-die termination mode is indicated by either a voltage or a duration of the signal, and
wherein the first command does not include a second indication on a second chip select terminal of the second memory device that the second portion is not targeted by the first command.

9. The memory system of claim 8, wherein the second memory device includes second circuitry configured to:
enter the on-die termination mode based at least in part on receiving the signal at the second on-die termination terminal.

10. The memory system of claim 9, wherein the second circuitry is further configured to exit the on-die termination mode after the first communication is completed.

11. The memory system of claim 8, wherein the first and second on-die termination terminal are input/output terminals.

12. The memory system of claim 8, wherein a single semiconductor die comprises the first memory device and the second memory device.

13. A method of operating a memory system, comprising:
transmitting a first command instructing a first portion of the memory system to perform a first communication with a memory host; and
performing the first communication with the first portion of the memory system while a second portion of the memory system operates in an on-die termination mode that is based at least in part on a signal transmitted from the first portion of the memory system to the second portion of the memory system,
wherein an impedance level of the on-die termination mode is indicated by either a voltage or a duration of the signal, and
wherein the first command is exclusive of an indication on a second chip select terminal of the second portion.

14. The method of claim 13, wherein the first command includes a first indication at a first chip select terminal of the first portion that the first portion is targeted by the first command.

15. The method of claim 13, wherein the first communication comprises at least one of a read operation or a write operation.

16. The method of claim 13, wherein a single semiconductor die comprises the first portion of the memory system and the second portion of the memory system.

* * * * *